United States Patent [19]

De Freitas

[11] 4,101,881
[45] Jul. 18, 1978

[54] MULTIPLE STATE RESPONSIVE DELTA-SIGMA CONVERTER AND DELAY LINE

[75] Inventor: Richard E. De Freitas, Westford, Mass.

[73] Assignee: Hybrid Systems Corporation, Bedford, Mass.

[21] Appl. No.: 667,146

[22] Filed: Mar. 15, 1976

[51] Int. Cl.² .......................................... H03K 13/02
[52] U.S. Cl. .............................. 340/347 R; 179/1 T; 325/38 B; 332/11 D; 340/347 M
[58] Field of Search ............... 340/347 AD, 347 DA, 340/347 C; 325/38 B; 328/55; 333/29; 179/1; 332/11 D

[56] References Cited

U.S. PATENT DOCUMENTS

| | | | |
|---|---|---|---|
| 3,711,850 | 1/1973 | Kelly | 340/347 NT |
| 3,877,026 | 4/1975 | Wintz et al. | 340/347 DA |
| 3,905,028 | 9/1975 | Wintz et al. | 340/347 NT X |
| 3,949,299 | 4/1976 | Song | 325/38 B |
| 3,979,676 | 9/1976 | Poma | 325/38 B |

OTHER PUBLICATIONS

Analog Devices, Inc., Analog-Digital Conversion Handbook, 6/72, pp. I-70, I-71, I-84 to I-87, II-46 to II-49.

Primary Examiner—Thomas J. Sloyan
Attorney, Agent, or Firm—Weingarten, Maxham & Schurgin

[57] ABSTRACT

A digital delay line for an analog signal having an improved efficiency in converting between the analog and digital signal formats. The delay line operates by converting an analog output into a representative series of binary ones and zeros which are applied through a shift register at a set clock rate. The shift register output, at a selected delay interval, is reconverted to the original analog levels. The conversions are governed by a logic network which increases the conversion efficiency to permit a lower clock rate and shorter shift register without a corresponding loss in frequency response.

8 Claims, 5 Drawing Figures

MULTIPLE STATE RESPONSIVE DELTA-SIGMA CONVERTER AND DELAY LINE

FIELD OF THE INVENTION

This invention relates to delay lines for audio signals in a digital form.

BACKGROUND OF THE INVENTION

Several techniques are known for delaying an analog signal, such as an audio frequency signal found in sound reproduction systems. A number of these techniques operate by converting the analog signal to a digital form which is then passed through a digital memory to be retrieved later and reconverted to analog form with a specified delay. A specific example of such a delay technique employs an analog-to-digital conversion based upon the delta-sigma modulation technique wherein the analog signal is converted to a sequence of binary ones and zeroes that are in turn applied to a shift register at a predetermined clock rate. The length of the shift register is a function of the desired delay interval and the clock rate required for a desired frequency response; the length increasing with both delay and frequency response desired.

Shift registers of a length sufficient to produce a delay useful in the audio field, for example, a significant fraction of a second, are an important cost item in the overall delay system. Where a specific delay interval is required, the only trade-off in shift register length comes at a sacrifice in frequency response which can in turn lead to a degradation in quality of the analog signal emerging from the delay system.

BRIEF SUMMARY OF THE INVENTION

In accordance with the teaching of the present invention an analog delay line is provided, operating on the principle of conversion of an analog signal to a clocked sequence of binary ones and zeroes, for application to a digital memory such as a shift register. The conversion from analog-to-digital signal form is accomplished in a manner which permits a reduction in clock rate and of shift register length without a corresponding loss in analog signal reproduction quality.

In implementing a delay line according to the present invention the analog signal to be delayed is applied to a comparator along with a reference signal level so that the comparator output, a digital level, reflects the relative magnitudes of the reference and analog signals. The reference signal level is established as the integrated output of a logic network which assumes one of a multiplicity of values defined by the level of the comparator output at a plurality of clock intervals as may, for example, be stored in a shift register.

By thus deriving the reference signal level from not only the current comparator output but past outputs through a predetermined interpretation in the logic network, it is possible to achieve an improvement in the trade-off between analog signal reproduction quality and shift register length by reducing clock rate. The use of a logic network to interpret the comparator output at several intervals further permits the delay line to be implemented with different characteristics as determined by the logic transformation in the network.

DESCRIPTION OF THE DRAWINGS

These and other features of the invention are more fully set forth below in the detailed description of the exemplary preferred embodiment and accompanying drawing of which.

DETAILED DESCRIPTION OF THE PREFERRED EMBODIMENT

The present invention contemplates a delay line for an analog signal employing a conversion from analog to digital form for accomplishing the delay in a digital memory and reconversion of the delayed digital signal to analog form wherein the conversions between analog and digital formats employ a logic network operating on past and present signal levels to achieve an improvement in conversion efficiency and resulting cost saving in the size of the digital memory.

Figure 1:
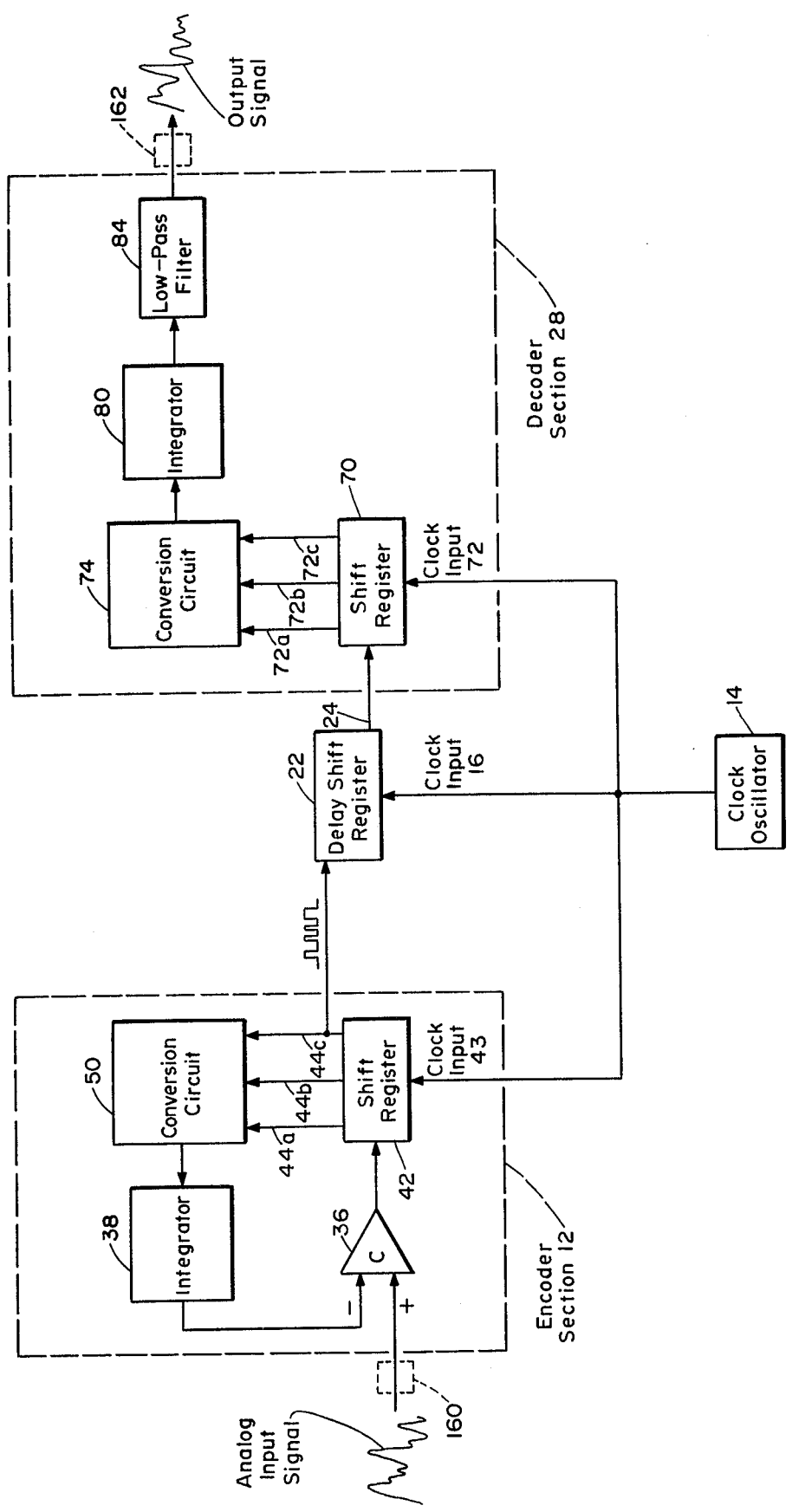
FIG. 1 is a block diagram of the invention.

The implementation of a preferred embodiment of this delay line may be best discussed with reference first to FIG. 1 showing a block diagram of each of the main sections of the invention. As shown there, an analog input signal is applied to an encoder section 12 of the delay line. A clock oscillator 14 generates a clock signal which is applied to the encoder section 12. In response to these two inputs, the encoder section 12 transforms the analog input into digital data which is synchronous with the clock signal.

The encoder output signal is applied to the input of a delay shift register 22, which is clocked by the clock signal from oscillator 14. The digital data from encoder section 12 will be shifted through shift register 22 in response to the clock signal applied thereto and will appear at output 24 of shift register 22 after a length of time determined by the length of shift register 22 and the frequency of the clock signal. While minor signal processing delays occur elsewhere in the system, they may be considered insignificant and the length of register 22 can be considered to define the total delay of the entire delay line at audio frequencies. The digital signals appearing at the output 24 of shift register 22 are applied to a decoder section 28 along with the clock signal. Decoder 28 transforms and reconverts the serial digital data from shift register 22 back into an analog output signal which is substantially the same as the analog input signal, but delayed in time by the operation of the circuit.

As shown in greater detail in FIG. 1, the analog input signal is applied to a noninverting input of a comparator 36. An inverting input to comparator 36 receives a reference signal from an integrator 38. Comparator 36 provides an output of logical levels one or zero. If the magnitude of the analog input signal exceeds the magnitude of the output of integrator 38, the comparator output will be a logical one signal. If the magnitude of the output of integrator 38 exceeds the magnitude of the analog input signal, the output of comparator 36 will be a logical zero signal. This comparator output is applied to the input of a multiple stage digital shift register 42 where, in response to the clock signal applied to shift register clock input 43, the digital level present at the input is shifted through the several stages of the shift register. In this example, shift register 42, a serial-in/parallel-out type of shift register, is shown as having three stages, although alternate embodiments of the invention may have fewer or more stages. The stages of shift register 42 will accordingly provide a record of present and past states of the output of the comparator 36 at intervals defined by the clock pulses. The outputs of each of the stages of shift register 42 on lines 44a, 44b and 44c, connecting respectively the outputs of the first, second, and third stages of shift register 42, are applied to a conversion logic circuit 50. In response to these inputs, conversion circuit 50 will produce at its output one of a set of analog voltage levels. Each level corresponds to one or more logic states of the signals on lines 44a, b and c and is provided by conversion circuit 50 for application to the input of integrator 38, to drive the output voltage of integrator 38 toward the level of the analog input signal.

Figures 2, 3:
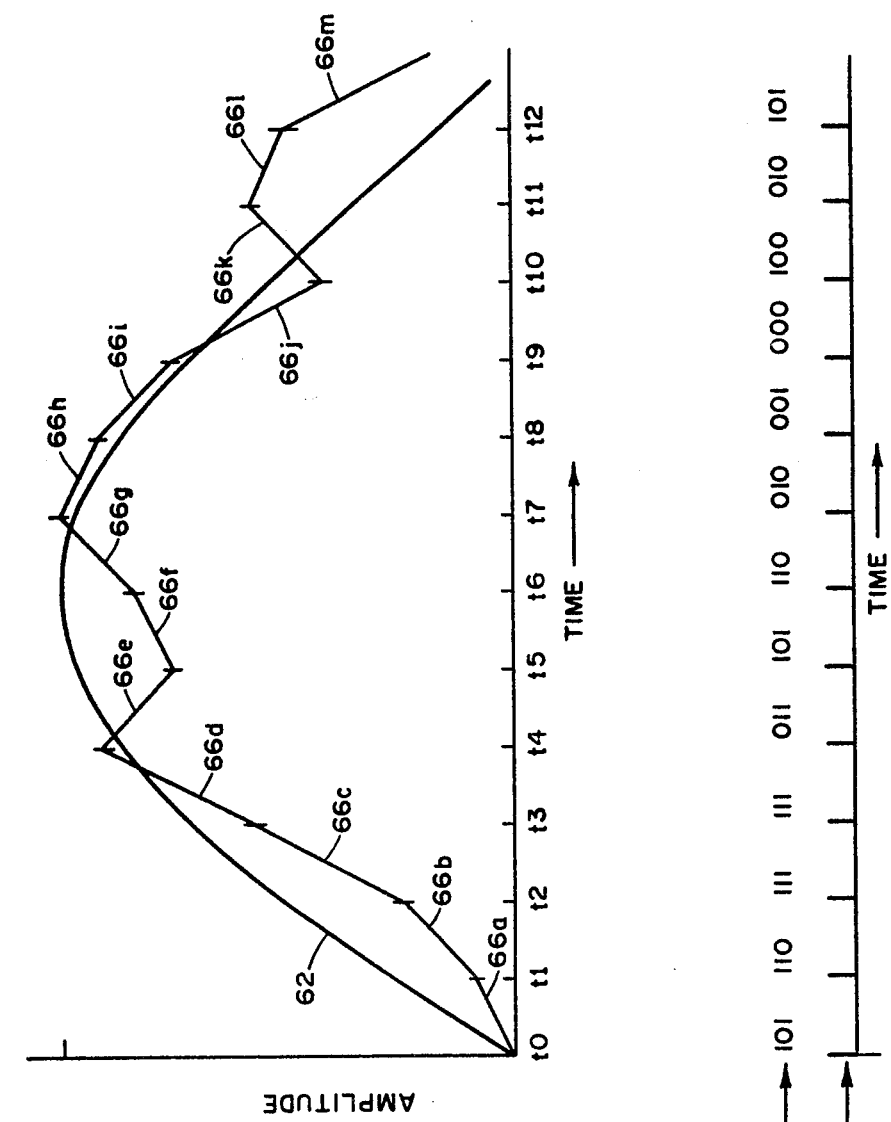
FIG. 2 is a table showing the operation of the conversion circuit.
FIG. 3 is a graph showing signals useful in explaining the operation of the invention.

To better understand the operation of conversion circuit 50, reference is made to the table of FIG. 2 showing a preferred logic transformation for the conversion circuit 50. The left-hand columns labeled "BIT 1", "BIT 2" and "BIT 3" identify the possible output states of the three lines, 44a, 44b and 44c, applied as inputs to conversion circuit 50. The right-hand column, designated as "OUTPUT," shows the relative value of the analog output signal levels produced by conversion circuit 50 in response to each of the eight possible states for the input on lines 44a, b and c. Thus, in accordance with FIG. 2, the output state of all zeros from shift register 42 to conversion circuit 50 will produce at the output of conversion circuit 50 an output of −4. Similarly, an input to conversion circuit 50 of the digital state 0-0-1 will produce an output of −2, and so on.

It should be noted that other logic transformations may be realized within the conversion circuit 50 and that more or less than three bits or three intervals of information may be utilized for the logic transformation. The description herein of a preferred embodiment of the present invention having a conversion circuit using three bits of digital data is not intended as a limitation upon the invention.

The digital output of the encoder section 12, typically the output of the last stage of shift register 42 on line 44c, is applied to the input of the delay shift register 22 as shown in FIG. 1. Delay shift register 22 is clocked by the clock signal. The encoder section digital output is clocked through delay shift register 22 and appears at the output thereof a number of clock pulses of the clock signal later, the number corresponding to the number of stages in delay shift register 22. Thus, the digital output signal of delay shift register 22 corresponds to the encoder 12 digital output delayed in time.

The digital output signal of delay shift register 22 is applied within section 28 for reconversion, according to the same logic transformation, to the input of a multi-stage digital shift register 70. The clock signal is applied to the clock input 72 of shift register 70 to clock the digital signal from shift register 22 into and through the several stages of shift register 70. The shift register 70 will normally have the same number of stages as shift register 42 in the encoder section 12, and like shift register 42, shift register 70 is a serial-in/parallel-out type of shift register. The outputs of each of the stages of shift register 70 are available on lines 72a, 72b and 72c denoting respectively the outputs of the first, second and third stages of the shift register 70. These parallel outputs are applied to a decoder conversion logic circuit 74. Decoder conversion logic circuit 74 is substantially identical to encoder conversion logic circuit 50 in the encoder section 12. The output signal of conversion circuit 74 is applied to the input of an integrator 80. The output of integrator 80 is connected to low-pass filter 84 which removes the abrupt slope shifts from the output of the integrator to produce a smoothed analog output signal from the delay line.

In the operation of the decoder circuit 28, the digital input to decoder circuit 28 is shifted through the shift register 70 by the clock signal from the oscillator 14. The parallel outputs 72a, b, c of shift register 70 are applied to the inputs of conversion logic circuit 74. These parallel digitial inputs to conversion circuit 74 correspond exactly to the digital signals produced by shift register 42 and applied to conversion circuit 50 in encoder section 12, but are delayed in time by the operation of delay shift register 22. Conversion logic circuit 70 operates according to the same transformation as does logic circuit 50. Since the interconnection of shift register 70, decoder conversion circuit 74, and decoder integrator 80 is the same as the interconnection of shift register 42, encoder conversion circuit 50, and encoder integrator 38, it can be seen that the output of integrator 80 in response to the digital signals from delay shift register 22 will be identical to the output of encoder integrator 38 at the time that those digital signals were originally generated in encoder section 12. Since, as stated above, the operation of encoder section 12 is such that the output of encoder integrator 38 closely approximates the analog input signal to comparator 36, the output of decoder integrator 80 will also closely approximate the analog input signal.

Distortion in the decoder integrator output signal from the corresponding analog input signal is primarily caused by the quantization of the analog input signal the analog-to-digital conversion process carried out in the encoder section. The clock signal is typically chosen to be much higher than the highest frequency component of interest in the analog input signal. By correctly selecting the parameters of filter 84, the quantization errors in the decoders integrator 80 output signal can be greatly attenuated by the filter since the spectral components of the errors are on the order of the frequency of the clock signal and are higher than the highest frequency in the analog signal being delayed. This results in an output from the low-pass filter 84 which corresponds very closely to the analog input signal applied to the delay line.

FIG. 3 shows an exemplary analog input signal to the encoder circuit 12 with the resulting signal levels which occur at other points in the circuit as an aid in describing the encoder operation. The X-axis in FIG. 3 corresponds to time, with the designations $t_0$, $t_1$, $t_2$, etc. denoting the times of occurrence of clock pulses from oscillator 14, as shown by signals 64 in FIG. 3. Waveform 66 shows the output of integrator 38 and conversion circuit 50 operating in accordance with the logic table of FIG. 2 in response to an analog input signal as shown by waveform 62.

The operation of encoder circuit 12 in this typical instance is as follows. Starting at time $t_0$ in FIG. 3, with the output of comparator 36 assumed to be at logic level one and with the contents of shift register 42, shown by signals 68, assumed to be 1-0-1 due to the previous operation of the circuit, conversion circuit 50 will provide an analog output proportional to +1. Henceforth, since it is understood that all analog signal values can be scaled, the signals shown in FIG. 2 will be taken to be absolute values. This value at output 52, when applied to integrator 38, will result in an integrator output with a slope of +1. This is shown by line segment 66a. At the next clock pulse occuring at time $t_1$, the output of comparator 36 will remain high since the input signal 62 is still larger than integrator output 66. When shift register 42 is clocked by clock signal 64 at time $t_1$, the new contents of shift register 42 becomes 1-1-0, as shown by signals 68. This 1-1-0 output from shift register 42 is applied to conversion circuit 50 and causes the output of conversion circuit 50 to be +2, in accordance with the table of operation shown in FIG. 2.

The conversion circuit output of magnitude +2 is applied to integrator 38 causing the output of the integrator to have a slope of +2, as shown by line segment 66b in FIG. 3. At time $t_2$, the integrator output 66 is still less than the input signal 62 and the output of comparator 36 will still be high. Shift register 42 is again clocked by clock signal 64, and the contents of shift register 42 becomes 1-1-1, as shown by signals 68. This produces an ouput from integrator 38 having a slope +4, as shown by line segment 66c, via the circuit operation described previously. At time $t_3$, shift register 42 is again clocked by clock signal 64; and since input signal 62 still exceeds integrator output 66, another "1" will be clocked into shift register 42. The output of integrator 38 continues to increase with a slope of +4, as shown by line segment 66d. At time $t_4$, integrator output signal 66 exceeds input signal 62; the output 40 of comparator 36 switches to a low state; and after being clocked at time $t_4$, the contents of shift register 42 becomes 0-1-1. This causes the output of integrator 38 to have a slope of −2, as shown by line segment 66e.

This process continues as shown from time $t_5$ through time $t_{12}$, and the output of integrator 38 in response to the input signal 62 is shown by line segments 66f through 66m. The result of the operation of encoder circuit 12, as described above, is that the output of integrator 38 closely approximates an analog input signal applied to the encoder circuit, and a digital sequence representative of this analog input signal is generated at the output of encoder circuit 12. The differences between integrator output signal 66 and analog input signal 62 shown in FIG. 3 are greatly exaggerated for purposes of illustration.

Figure 4:
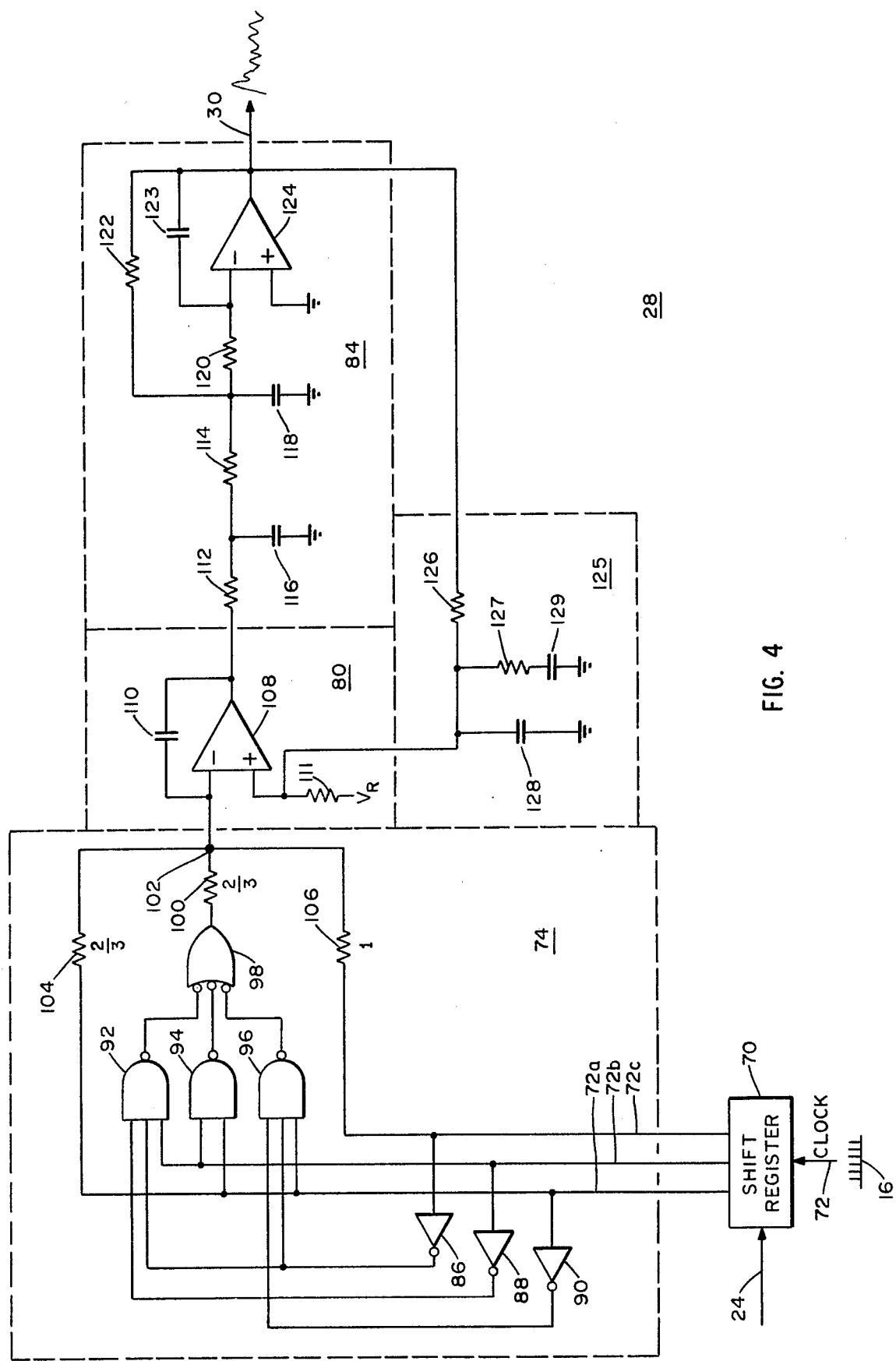
FIG. 4 is a detailed drawing of one particular embodiment of the encoder section of the invention.

FIG. 4 shows in detail one particular implementation of decoder circuit 28. As shown there the parallel outputs on lines 72a, 72b and 72c from shift register 70 are applied within conversion logic circuit 74 through respective inverters 86, 88, and 90, to AND gates 92, 94, and 96 and the outputs of these gates are applied to OR gate 98. Particularly, gate 92 receives input signals from inverters 86 and 88 and line 72a; gate 94, from lines 72a and b; and gate 96, from inverters 88 and 90 and line 72a. The output of OR gate 98 is connected through a resistor 100 to a current summing node 102. The lines 72a and 72c are also connected to node 102 through resistors 104 and 106 respectively as shown. Resistors 100 and 104 are equal in value and are ⅔ of the resistance of resistor 106. Logic levels are selected for circuit 74 to apply the same high or low level potential to resistors 100, 104 and 106. Circuit 80 operates as explained below to hold node 102 halfway between these logic levels. Thus the respective currents in each of the resistors 100, 104, 106 will always have the same magnitude, differing only in direction in response to the applied logic level.

In the operation of the decoder conversion circuit 74, the current flowing through each of the resistors 100, 104 and 106 is inversely proportional to the resistor value. Therefore, the current flowing through resistors 104 and 100 is proportionally 1.5 and the current through resistor 106 is prportionally 1. This current will flow into or out of node 102. Thus, the logical levels present on lines 72 determine the total current flowing into or out of node 102, and the value of this current flow corresponds to the conversion circuit operation table shown in FIG. 2.

For example, if the inputs 72 from shift register 70 to conversion circuit 74 are 0-0-0, the potential applied to resistors 100, 104 and 106 will all be logical low levels; and the current flowing out of node 102 will be the sum of two currents proportional to 1.5 flowing out of resistors 104 and 100 each plus a current proportional to 1 flowing through resistor 106, for a total current flowing out of node 102 proportional to 4. Similarly, other inputs will produce the desired output at node 102. For an input of 0-0-1, the logic applies high outputs to resistors 100 and 104 and a low output to resistor 106 resulting in a net current out of node 102 proportional to 2. That the operation of conversion circuit 74 corresponds to the remainder of the table of operation in FIG. 2 can be easily verified.

The current flowing into or out of node 102 flows into the input of integrator 80 which integrates this current and produces a corresponding output voltage. This integrator is a conventional operational amplifier integrating circuit comprising amplifier 108 and integrating negative feedback capacitor 110. The input from conversion circuit 74 to integrator 80 is applied to the inverting input, while the noninverting input of amplifier 108 receives a voltage midway between the logical high and low output voltage levels as described below. The operation of the amplifier 108 forces its inverting input to remain at the same voltage as the noninverting input thereby keeping node 102 at a potential midway between the logic circuitry high and low output voltage levels, as required above.

The output from amplifier 108 is applied to low-pass filter 84. While this filter may be implemented in many ways, the filter shown in FIG. 4 is an RC low-pass filter, having a series resistor 112 and a shunt capacitor 116, followed by a two-pole active filter. The active filter has an operational amplifier 124, resistors 114, 120 and 122 and capacitors 118 and 123. Amplifier 124 also serves as an inverting amplifier which buffers the low-pass filter output.

In order to avoid the effects of drift in integrator 80, a DC feedback circuit 125 is provided and includes series resistor 126 and series shunt resistor 27 and capacitor 129 and shunt capacitor 128. This circuit 125 connects the output of amplifier 124 with the noninverting input of amplifier 108 within integrator 80. Any drift in the longterm average output level of integrator 80 will be inverted by inverting amplifier 124. Resistors 126 and 127 and capacitors 128 and 129 are chosen so that the attenuation of the frequencies of interest at output 30 is very high, so that only the long-term variations in the average DC level of output 30 are fed back to the noninverting input of amplifier 108. The noninverting input of integrator 80 is connected by resistor 111 to a reference voltage $V_R$ equal to the high level output voltage of the logic in the conversion circuit 74. With resistors 111 and 126 chosen to be equal in value, the noninverting input of the amplifier 108 will be kept at a DC level halfway between ground and $V_R$ (the two logic levels), as required for the proper operation of the conversion circuit 74.

In applications where more than one delay time tap is needed, more decoder circuits of the type shown in FIG. 4 can be provided to respond to selected taps in the delay line register 22.

Figure 5:
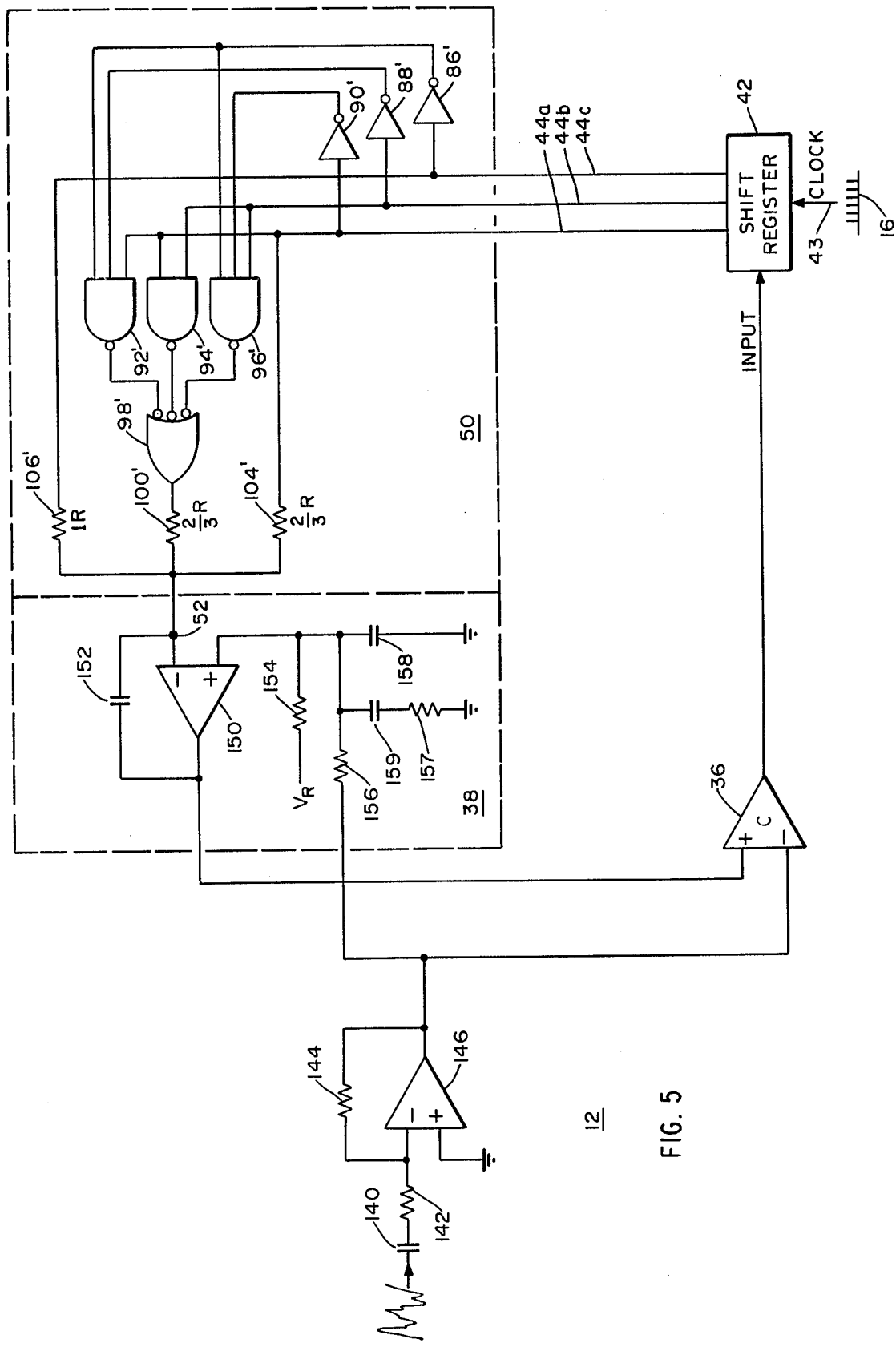
FIG. 5 is a detailed diagram of one particular embodiment of the decoder section of the invention.

With reference now to FIG. 5, there is shown an exemplary, detailed implementation of the encoder circuit 12 suitable for use in a system with decoder circuit 28 as shown in FIG. 4. As shown in FIG. 5, the analog input signal is applied through a coupling capacitor 140 to a buffer amplifier 146 having gain determining input and feedback resistors 142 and 144 respectively. The output of amplifier 146 is applied to the inverting input of comparator 36. The noninverting input to comparator 36 receives the output of integrator 38. As shown in FIG. 1, the output of comparator 36 is applied to shift register 42, the outputs of which on lines 44a, 44b and 44c are applied to encoder conversion logic circuit 50. Encoder conversion logic circuit 50 is identical with the decoder conversion logic circuit 74 shown in FIG. 4 and the explanation of its operation will not be repeated. The components of encoder conversion circuit 50 denoted by primed numbers correspond to the same components denoted by unprimed numbers in the explanation of decoder conversion logic circuit 74. The inputs on lines 72a, b, c are replaced by the signals on lines 44a, b, c.

The output of conversion circuit 50 is connected to the inverting input of integrator 38. Similarly to integrator 38 in the encoder circuit 12, this input is held at a voltage halfway between the high and low logic level output voltages. Integrator 38 is composed of an operational amplifier 150 and integrating capacitor 152 in a negative feedback loop. Resistor 154, equal in value to resistor 156, connects the noninverting input of amplifier 150 with reference voltage $V_R$. The output of integrator 38 is connected to the noninverting input of comparator 36.

The encoder and decoder conversion logic circuits can be implemented using read-only-memories in place of the discrete logic shown. This method is particularly important in delay lines having more than three sequential comparator outputs applied to the conversion circuit inputs. As the number of these inputs increases, the complexity of the logic required increases, and using read-only-memories becomes a more efficient way of implementing the conversion logic circuit.

While the parameters of the DC offset compensation circuit 125 shown in FIG. 4 may be chosen to minimize the distortion produced in the output signal from the decoder circuit, some distortion is invevitably introduced by this circuit. Resistors 156 and 157 and capacitors 158 and 159 shown in FIG. 5 are connected to form the same circuit as the DC feedback circuit 125 in the encoder circuit of FIG. 4 and are for the purpose of providing a compensation for this distortion to reduce or eliminate it. The DC feedback circuit 125 shown in FIG. 4 is in a negative feedback path around the two amplifiers 108 and 124 which make up the encoder integrator 80 and the low-pass filter 84. In order to achieve the inverse transfer function of the network in this negative feedback loop, that network can be inserted into the positive feedback loop of another operational amplifier (150) as is shown in FIG. 4. DC stabilization is achieved here by the overall negative feedback of the encoder through comparator 36, register 42 and circuit 50.

Due to the operation of the circuit, the noise introduced by the circuit into the output signal will tend to be greater at higher frequencies. Thus, in some applications, particularly where high quality audio signals are concerned, it may be desirable to add before the input to the delay line a preemphasis circuit 160, shown in FIG. 1, which boosts the general level of the higher frequencies applies to the delay line. A corresponding de-emphasis network 162 would then be connected to the output of the delay line to restore the original signal. Such a system effectively attenuates high frequency noise. These types of systems are well known to those in the art and many different types of these systems would be suitable for use with the invention disclosed herein.

The above-described preferred embodiments are intended to be exemplary in structure and specific values, permitting modifications and alterations thereto within the spirit of the invention. The scope of the invention is thus to be limited only as defined in the following claims.

What is claimed is:

1. A delay line for producing a delay in an analog input signal comprising:

comparator means for producing a digital output signal indicative of the level of the analog input signal with respect to a variable reference signal level;

means for storing the digital values of said digital output signal at a plurality of successive time periods;

conversion means for producing the reference signal as a function of a plurality of said stored digital values at said plurality of sequential time periods such that the reference signal is varied in a direction which lessens the difference between it and the analog input signal applied to said comparator means;

said conversion means including:

means for producing an intermediate signal as a predetermined function of said plurality of stored digital values; and an active integrator circuit providing true integration for integrating said intermediate signal to produce said variable reference signal such that the rate of change of said variable reference signal with respect to time is proportional to the amplitude of the intermediate signal throughout the dynamic range of said variable reference signal; and decoder means responsive to the stored digital values of said output signal at the said plurality of successive time periods for producing a digital representation thereof after a predetermined time delay, including:

means for producing second intermediate signals having different analog values as a predetermined function of different combinations of plural digital values in the delayed digital representation; and means for integrating said second intermediate signals to provide said analog output signal;

wherein the number of digital values used in providing said intermediate signals is three;

wherein the predetermined function for producing the first and second intermediate signals produces intermediate signals of a first polarity in response to digital values of 000, 001, 010, and 011, and produces intermediate signals of the opposite polarity in response to digital values of 100, 101, 110, and 111;

wherein the intermediate signals of the first polarity are further produced such that: in response to a digital value of 000, the intermediate signal has a first magnitude; in response to a digital value of 001, the intermediate signal has a second magnitude less than the first magnitude; in response to a digital value of 010, the intermediate signal has a third magnitude less than the second magnitude; and in response to a digital value of 011, the intermediate signal has a fourth magnitude intermediate the first and third magnitudes; all of said previous four intermediate signals being of the first polarity; and wherein the intermediate signals of the opposite polarity are produced so that in response to digital values of 111, 110, 101, and 100, the magnitudes of the intermediate signal are substantially equal to said first, second, third and fourth values, respectively, all of said second four intermediate signals being of the opposite polarity.

2. The delay line of claim 1 wherein the second and third values are substantially equal.

3. A delay line for producing a delay in an analog input signal comprising:

comparator means for producing a digital output signal indicative of the level of the analog input signal with respect to a variable reference signal level;

means for storing the digital values of said digital output signal at a plurality of successive time periods;

conversion means for producing the reference signal as a function of a plurality of sequential time periods such that the reference signal is varied in a direction which lessens the difference between it and the analog input signal applied to said comparator means;

said conversion means including:

means for producing an intermediate signal as a predetermining function of said plurality of stored digital values; and an active integrator circuit providing true integration for integrating said intermediate signal to produce said variable reference signal such that the rate of change of said variable reference signal with respect to time is proportional to the amplitude of the intermediate signal throughout the dynamic range of said variable reference signal; and decoder means responsive to the stored digital values of said output signal at said plurality of successive time periods for producing a digital representation thereof after a predetermined time delay, including:

means for producing second intermediate signals having different analog values as a predetermined function of different combinations of plural digital values in the delayed digital representation; and means for integrating said second intermediate signals to provide said analog output signal;

wherein the number of digital values used in providing said intermediate signals is three; and wherein the predetermined functions for producing the first and second intermediate signals for the plural digital values is defined as:

| digital values | intermediate signals |
| --- | --- |
| 0 0 0 | −4 |
| 0 0 1 | −2 |
| 0 1 0 | −1 |
| 0 1 1 | −2 |
| 1 0 0 | +2 |
| 1 0 1 | +1 |
| 1 1 0 | +2 |
| 1 1 1 | +4 |

4. The delay line of claim 3 wherein the decoder means further includes means for low-pass filtering the integrated second intermediate signals to provide said analog output signal.

5. The delay line of claim 3 wherein the delay line inherently adds noise of a predetermined frequency characteristic to said analog output signal and further including:

means for filtering the analog signal with a first characteristic for application to the comparator means; and means for filtering said analog output signal with a compensating characteristic to offset said first characteristic;

said first and second characteristics being defined to reduce noise added to the analog output signal by the delay line.

6. The delay line of claim 3 wherein the means for storing the digital values includes a first shift register.

7. The delay line of claim 6 wherein the means for producing the delayed digital representation includes a second shift register responsive to the output of the first shift register.

8. The delay line of claim 7 further including a clock providing a common clock signal to clock inputs of both the first and second shift registers.

* * * * *

UNITED STATES PATENT AND TRADEMARK OFFICE
CERTIFICATE OF CORRECTION

PATENT NO. : 4,101,831
DATED : July 18, 1978
INVENTOR(S) : Richard E. De Freitas It is certified that error appears in the above—identified patent and that said Letters Patent are hereby corrected as shown below:

Column 6, line 8, "prportionally" should read --proportionally--.
Column 7, line 55, "invevitably" should read --inevitably--.
Column 8, line 11, "applies" should read --applied--.

Signed and Sealed this

Sixth Day of March 1979

[SEAL]

Attest:

RUTH C. MASON
Attesting Officer

DONALD W. BANNER
Commissioner of Patents and Trademarks